United States Patent [19]
McCoy

[11] Patent Number: 6,134,268
[45] Date of Patent: Oct. 17, 2000

[54] APPARATUS FOR PERFORMING A NON-INTEGER SAMPLING RATE CHANGE IN A MULTICHANNEL POLYPHASE FILTER

[75] Inventor: James Wesley McCoy, Irving, Tex.

[73] Assignee: Motorola, Inc., Schaumburg, Ill.

[21] Appl. No.: 09/176,781

[22] Filed: Oct. 22, 1998

Related U.S. Application Data

[63] Continuation-in-part of application No. 09/174,861, Oct. 19, 1998.
[51] Int. Cl.[7] .................................................. H03H 7/30
[52] U.S. Cl. .............................. 375/229; 375/260; 341/61; 708/313
[58] Field of Search .................................... 375/219, 229, 375/230, 231, 232, 260, 344; 370/210, 364; 341/61; 708/313, 322, 323, 403, 404, 405

[56] References Cited

U.S. PATENT DOCUMENTS

| | | | |
|---|---|---|---|
| 5,323,391 | 6/1994 | Harrison | 370/210 |
| 5,504,785 | 4/1996 | Becker et al. | 375/344 |
| 5,537,435 | 7/1996 | Carney et al. | 375/219 |
| 5,631,610 | 5/1997 | Sandberg et al. | 332/170 |
| 5,699,363 | 12/1997 | Wishart et al. | 370/497 |
| 5,903,232 | 5/1999 | Zarubinsky et al. | 341/61 |

OTHER PUBLICATIONS

Yim et al., "Filter Banks with Rational Decimation and Interpolation Rates," Electronics Letters, vol. 28, No. 28, pp. 726–727, Apr. 1992.

Ronald E. Crochiere and Lawrence R. Rabiner, *Multirate Digital Signal Processing*, pp 325–326, 1983, USA.

Adil Benyassine and Ali N. Akansu, *Optimal Subchannel Structuring and Basis Selection for Discrete Multicarrier Modulation*, pp 97–101, May 1995, USA.

Renyuan Li and Gunnar Stette, *Time–Limited Orthogonal Multicarrier Modulation Schemes*, pp 1269–1272, 1995, USA.

Ravi P Ramachandran and Peter Kabal, Bandwidth Efficient Transmultiplexers, Part 1: Synthesis, pp 70–84, 1992, USA.

*Primary Examiner*—Stephen Chin
*Assistant Examiner*—Chieh M. Fan
*Attorney, Agent, or Firm*—R. Louis Breeden

[57] ABSTRACT

A multichannel polyphase filter (304, 602) includes a processing system (204, 506) for accepting and processing M input channels of data, each sampled at an input sampling rate, wherein M is a positive integer greater than unity. The processing system is programmed to provide a commutator (308, 606) for the multichannel polyphase filter, wherein the position of the commutator is decoupled from the phase of a filter impulse response selected for the position, thereby allowing the multichannel polyphase filter to be operated at a sampling rate that is a non-integer multiple of the input sampling rate. The processing system is further programmed to operate the multichannel polyphase filter at the non-integer multiple of the input sampling rate to obtain a non-integer sampling rate change.

19 Claims, 4 Drawing Sheets

APPARATUS FOR PERFORMING A NON-INTEGER SAMPLING RATE CHANGE IN A MULTICHANNEL POLYPHASE FILTER

RELATED APPLICATION

This application is a continuation-in-part of application Ser. No. 09/174,861, filed Oct. 19, 1998 by McCoy, entitled "APPARATUS FOR PERFORMING A NON-INTEGER SAMPLING RATE CHANGE IN A MULTICHANNEL POLYPHASE FILTER." Said application is hereby incorporated herein by reference.

FIELD OF THE INVENTION

This invention relates in general to digital signal processing techniques, and more specifically to a method and apparatus for performing a non-integer sampling rate change in a multichannel polyphase filter.

BACKGROUND OF THE INVENTION

Polyphase filters are known. Such filters operate by multiplying selected phases, or samples, of a filter impulse response with samples of the input signal(s). Prior-art multichannel polyphase filters have synchronized the selected phases of the filter impulse response with the positions of a commutator of the filter. In prior-art multichannel polyphase filters, a given position of the commutator has corresponded uniquely to a predetermined phase of the filter impulse response. Indeed, those of skill in the art of polyphase filter design have simply accepted that in multisubchannel polyphase modulators, the subchannel sampling rate is an integral multiple of the input sample rate, which implies that the channel bandwidth has to be an integer multiple of the input sample rate. Thus, in prior-art multisubchannel modulators and demodulators using polyphase filters, the subchannel bandwidth can either be the same as the input sample rate, producing subchannels too closely spaced for a receiver to adequately filter out adjacent subchannels, or the subchannel bandwidth can be twice the input sample rate, thus wasting spectrum with overly-separated subchannels.

For the above reasons, multichannel polyphase filters have not been considered a good choice for multisubchannel modulators and demodulators, where a subchannel bandwidth of slightly more, e.g., 12 percent more, than the input sample rate is desirable to prevent adjacent subchannel interference without wasting spectrum. On the other hand, the polyphase filter is known to be one of the most efficient ways for obtaining a sampling rate change.

Thus, what is needed is an apparatus for performing a non-integer sampling rate change in a multichannel polyphase filter. The apparatus preferably will enable an efficient multisubchannel polyphase modulator/demodulator that has superior flexibility of subchannel spacing.

SUMMARY OF THE INVENTION

An aspect of the present invention is a multichannel polyphase filter for performing a non-integer sampling rate change. The multichannel polyphase filter comprises a processing system for accepting and processing M input channels of data, each sampled at an input sampling rate, wherein M is a positive integer greater than unity. The processing system is programmed to provide a commutator for the multichannel polyphase filter, wherein position of the commutator is decoupled from phase of a filter impulse response selected for the position, thereby allowing the multichannel polyphase filter to be operated at a sampling rate that is a non-integer multiple of the input sampling rate; and to operate the multichannel polyphase filter at the non-integer multiple of the input sampling rate to obtain the non-integer sampling rate change.

Another aspect of the present invention is a modulation engine for facilitating a modulation of M subchannels in parallel, wherein M is a positive integer greater than unity. The modulation engine comprises a first processing element, arranged to accept M baseband signals corresponding to the M subchannels and sampled at a baseband sampling rate; and to transform the M baseband signals into M time-domain signals, each sampled at the baseband sampling rate. The modulation engine further comprises a multichannel polyphase filter coupled to the first processing element for performing a non-integer sampling rate change on the M time-domain signals. The multichannel polyphase filter comprises a second processing element for accepting and processing the M time-domain signals. The second processing element is arranged to provide a commutator for the multichannel polyphase filter, wherein position of the commutator is decoupled from phase of a filter impulse response selected for the position, thereby allowing the multichannel polyphase filter to be operated at a sampling rate that is a non-integer multiple of the sampling rate of the M time-domain signals; and to operate the multichannel polyphase filter at the non-integer multiple of the sampling rate of the M time-domain signals to obtain the non-integer sampling rate change.

A third aspect of the present invention is a demodulation engine for facilitating a demodulation of at least two of M subchannels in parallel, wherein M is a positive integer greater than unity. The demodulation engine comprises a multichannel polyphase filter for accepting from a receiver a composite signal derived from the at least two of the M subchannels and for performing a non-integer sampling rate change on the composite signal. The multichannel polyphase filter comprises a first processing element for accepting and processing the composite signal. The first processing element is arranged to provide a commutator for the multichannel polyphase filter, wherein position of the commutator is decoupled from phase of a filter impulse response selected for the position, thereby allowing the multichannel polyphase filter to be operated at a sampling rate that is a non-integer multiple of the sampling rate of the composite signal; and to operate the multichannel polyphase filter at the non-integer multiple of the sampling rate of the composite signal to obtain the non-integer sampling rate change, thereby generating at least two rate-changed signals. The multichannel polyphase filter further comprises a second processing element coupled to the multichannel polyphase filter and arranged to transform the at least two rate-changed signals into at least two frequency-domain signals, thereby generating at least two baseband signals.

A fourth aspect of the present invention is a transmitter for modulating M subchannels in parallel, wherein M is a positive integer greater than unity. The transmitter comprises a first processing element arranged to accept M baseband signals corresponding to the M subchannels and sampled at a baseband sampling rate; and to transform the M baseband signals into M time-domain signals, each sampled at the baseband sampling rate. The transmitter further comprises a multichannel polyphase filter coupled to the first processing element for performing a non-integer sampling rate change on the M time-domain signals. The multichannel polyphase filter comprises a second processing element for accepting and processing the M time-domain signals. The second processing element is arranged to provide a commutator for the multichannel polyphase filter, wherein position of the commutator is decoupled from phase of a filter impulse response selected for the position, thereby allowing the multichannel polyphase filter to be operated at a sampling rate that is a non-integer multiple of the baseband sampling rate; and to operate the multichannel polyphase filter at the non-integer multiple of the baseband sampling rate to obtain the non-integer sampling rate change and to generate a frequency-multiplexed composite signal. The transmitter further comprises a wireless modulator for modulating a wireless carrier with the frequency-multiplexed composite signal to produce a wireless signal having M subchannels.

A fifth aspect of the present invention is a receiver for demodulating at least two of M subchannels in parallel, wherein M is a positive integer greater than unity. The receiver comprises a receiver front end for converting a wireless signal having the M subchannels into a composite signal having a sampling rate and derived from the at least two of the M subchannels, and a multichannel polyphase filter coupled to the receiver front end for accepting from the receiver the composite signal and for performing a non-integer sampling rate change on the composite signal. The multichannel polyphase filter comprises a first processing element for accepting and processing the composite signal. The first processing element is arranged to provide a commutator for the multichannel polyphase filter, wherein position of the commutator is decoupled from phase of a filter impulse response selected for the position, thereby allowing the multichannel polyphase filter to be operated at a sampling rate that is a non-integer multiple of the sampling rate of the composite signal; and to operate the multichannel polyphase filter at the non-integer multiple of the sampling rate of the composite signal to obtain the non-integer sampling rate change, thereby generating at least two rate-changed signals. The receiver further comprises a second processing element coupled to the multichannel polyphase filter and arranged to transform the at least two rate-changed signals into at least two frequency-domain signals, thereby generating at least two baseband signals.

DETAILED DESCRIPTION OF THE DRAWINGS

Figure 1:
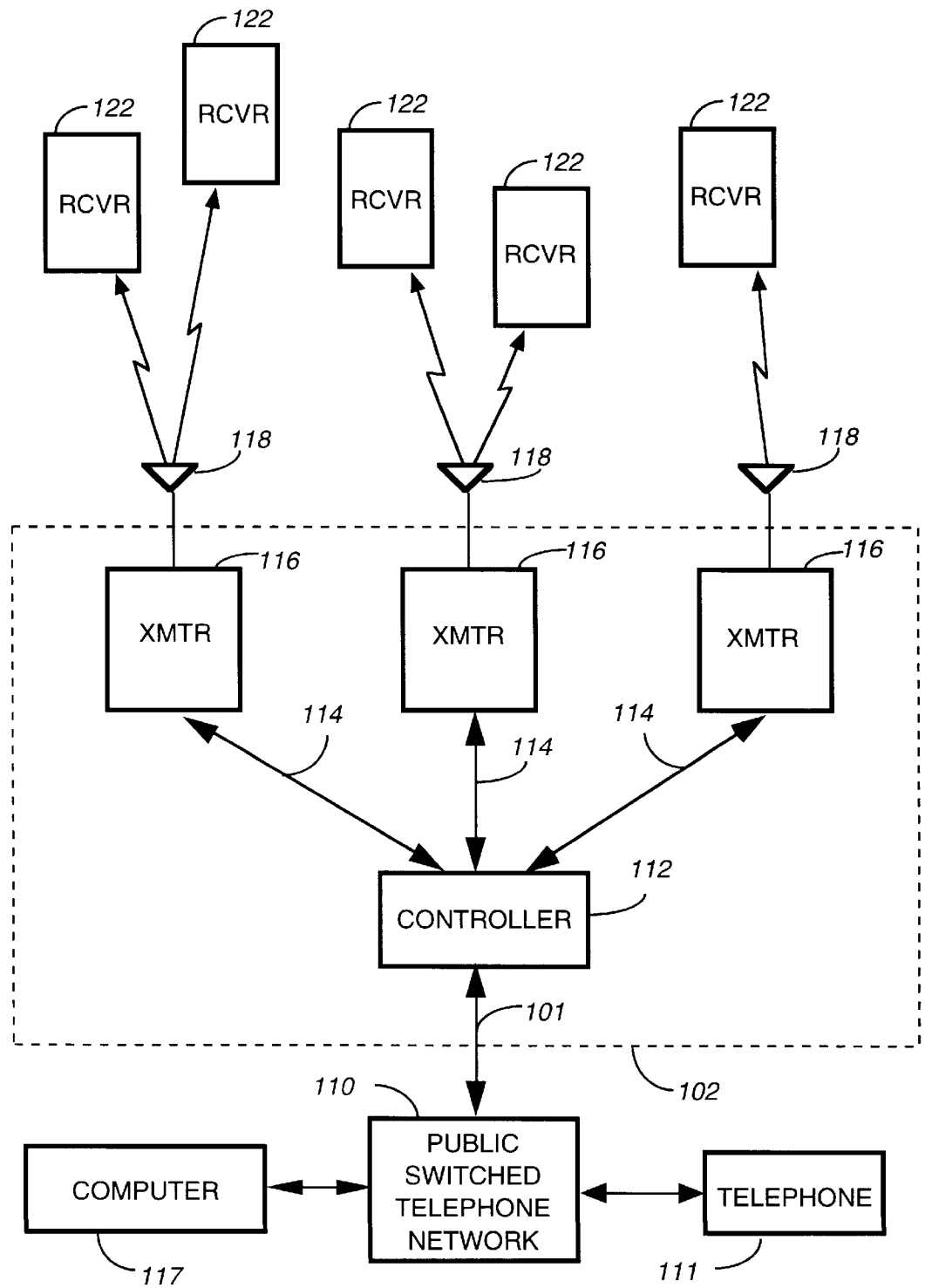
FIG. 1 is an electrical block diagram of an exemplary wireless communication system in accordance with the present invention.

FIG. 1 is an electrical block diagram of an exemplary wireless communication system in accordance with the present invention, comprising a fixed portion 102 including a controller 112 and a plurality of transmitters 116, the wireless communication system also including a plurality of receivers 122. The transmitters 116 preferably communicate with the receivers 122 utilizing conventional wireless communication techniques, e.g., radio, infrared, and ultrasonic channels, and are coupled by communication links 114 to the controller 112, which controls the transmitters 116.

The controller 112 is preferably a combination of the Wireless Messaging Gateway (WMG™) Administrator! paging terminal, and the RF-Conductor!™ message distributor manufactured by Motorola, Inc. The transmitters 116 are preferably similar to the RF-Orchestra! transmitter, modified in accordance with the present invention. The receivers 122 are preferably similar to the PageWriter™ wireless communication units, also manufactured by Motorola, Inc., and have hardware and software modified in accordance with the present invention, as described further below. It will be appreciated that other similar equipment can be utilized as well for the controller 112, the transmitters 116, and the receivers 122.

Each of the transmitters 116 transmits RF signals to the receivers 122 via an antenna 118. The RF signals transmitted by the transmitters 116 to the receivers 122 (outbound messages) comprise selective call addresses identifying the receivers 122, and data messages originated by a caller, as well as commands originated by the controller 112 for adjusting operating parameters of the wireless communication system.

The controller 112 preferably is coupled by telephone links 101 to a public switched telephone network (PSTN) 110 for receiving selective call message originations therefrom. Selective call originations comprising voice and data messages from the PSTN 110 can be generated, for example, from a conventional telephone 111 or a conventional computer 117 coupled to the PSTN 110. It will be appreciated that, alternatively, other types of communication networks, e.g., packet switched networks, the Internet, and local area networks, can be utilized as well for transporting originated messages to the controller 112.

The over-the-air protocol utilized for the transmissions is preferably selected from Motorola's well-known FLEX™ family of digital selective call signaling protocols. These protocols utilize well-known error detection and error correction techniques and are therefore tolerant to bit errors occurring during transmission, provided that the bit errors are not too numerous. It will be appreciated that other suitable protocols can be used as well. It will be further appreciated that, while one embodiment for practicing the present invention is a one-way wireless communication system, the present invention is applicable also to a two-way wireless communication system.

Figure 2:
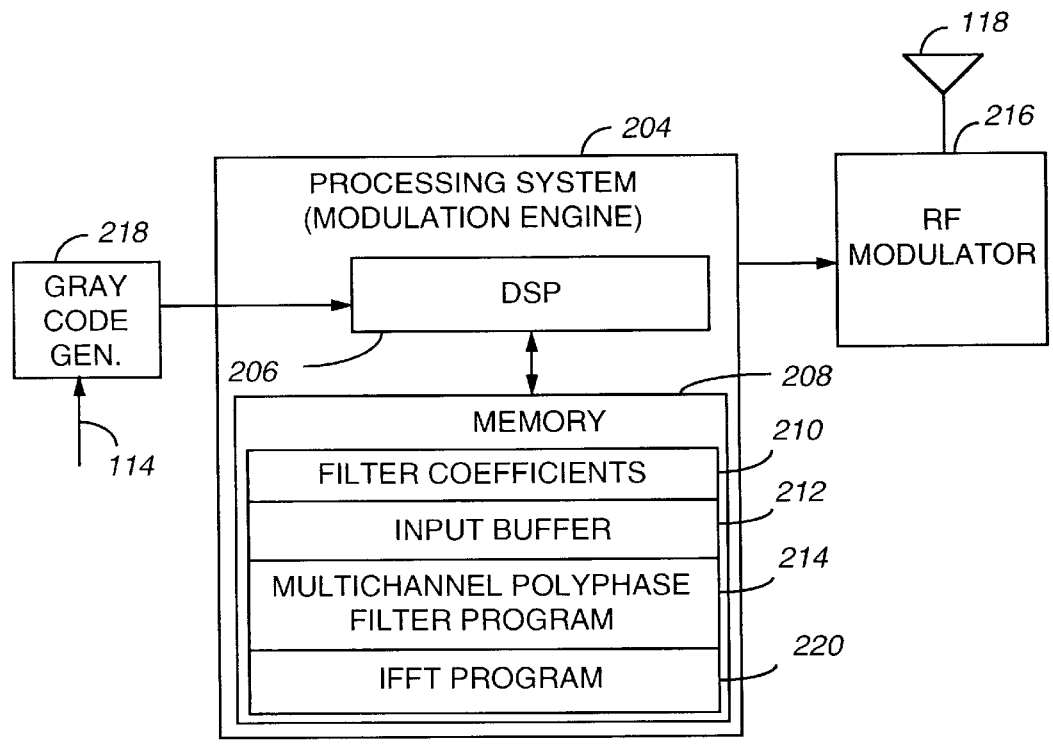
FIG. 2 is an electrical block diagram of an exemplary transmitter in accordance with the present invention.

FIG. 2 is an electrical block diagram of an exemplary transmitter 116 in accordance with the present invention. The transmitter 116 preferably comprises a gray code generator 218 responsive to the controller 112 for generating M baseband signals corresponding to M subchannels and sampled at a first baseband sampling rate, where M is a positive integer greater than unity, e.g., 16. The gray code generator 218 is coupled to a processing system 204, or modulation engine, for accepting and processing the M baseband signals. The processing system 204 preferably comprises a conventional digital signal processor (DSP) 206 and a conventional memory 208 including RAM for providing an input buffer 212, and ROM for storing pre-programmed parameters and software, such as filter coefficients 210, a multichannel polyphase filter program 214, and an inverse fast Fourier transform (IFFT) program 220. The transmitter 116 further comprises a wireless modulator, such as a conventional RF modulator 216, for modulating a wireless carrier with a frequency-multiplexed composite signal (generated by the processing system 204) to produce a wireless signal, e.g., an RF signal, having M subchannels. In the preferred embodiment, the DSP 206 is a model DSP56800, manufactured by Motorola, Inc. of Schaumburg, Ill., and executes software readily written by one of ordinary skill in the art, given the teachings of the instant disclosure. It will be appreciated that, alternatively, other similar DSPs can be substituted for the DSP56800. It will be further appreciated that, alternatively, some or all of the processing system 204 can be realized in hardware instead of through software programming of the DSP 206 and, in addition, that the memory 208 can be integral to the DSP 206. Operation of the processing system 204 in accordance with the present invention will be described further below.

Figure 3:
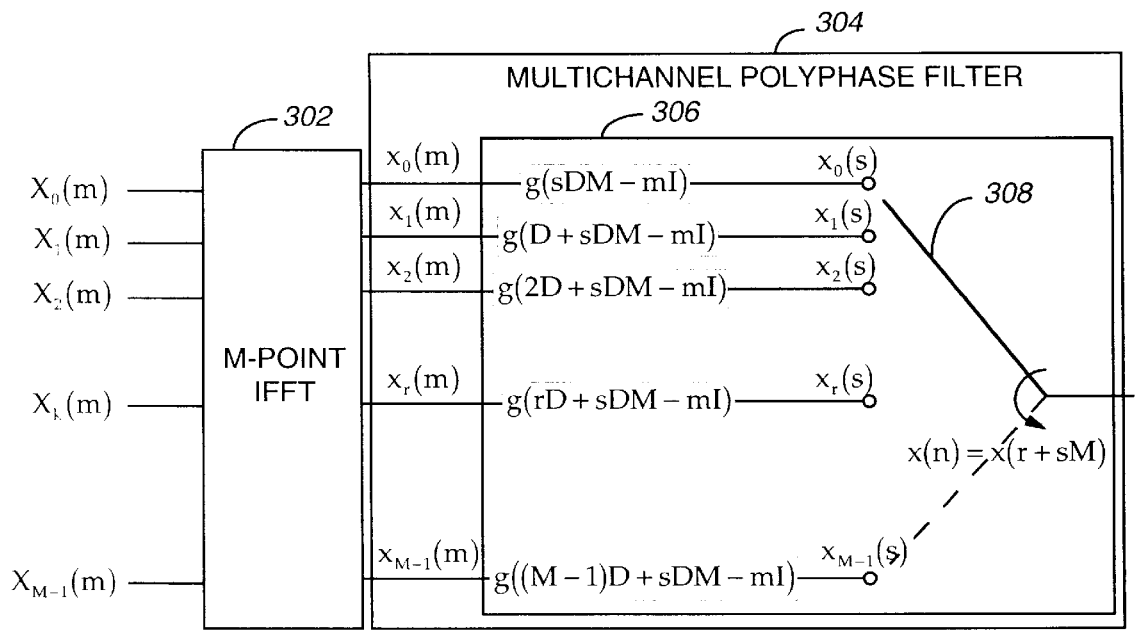
FIG. 3 is an architecture diagram of an exemplary multisubchannel modulation engine in accordance with the present invention.

FIG. 3 is an architecture diagram of an exemplary multisubchannel modulation engine 300 in accordance with the present invention. The modulation engine 300 preferably comprises an M-point inverse fast Fourier transform (IFFT) processor 302 for accepting from the gray code generator 218 the M baseband signals corresponding to the M subchannels and sampled at the baseband sampling rate, and transforming the M baseband signals into M time-domain signals, each sampled at the baseband sampling rate, through well-known techniques.

The modulation engine 300 further comprises a multichannel polyphase filter 304 coupled to the IFFT for performing a non-integer sampling rate change on the M time-domain signals. The multichannel polyphase filter 304 comprises a filter processor 306 for accepting and processing the M time-domain signals. In accordance with the present invention, the filter processor 306 is arranged to provide a commutator 308 for the multichannel polyphase filter 304, wherein the position of the commutator 308 is decoupled from the phase of the filter impulse response g(u) selected for the position, thereby allowing the multichannel polyphase filter 304 to be operated at a sampling rate that is a non-integer multiple of the sampling rate of the M time-domain signals. The filter processor 306 is further arranged to operate the multichannel polyphase filter at the non-integer multiple of the sampling rate of the M time-domain signals to obtain the non-integer sampling rate change. Preferably, both the IFFT processor 302 and the filter processor 306 are implemented in the processing system 204.

In somewhat greater detail, $X_k(m)$ are gray coded symbols or baseband signals of the kth subchannel, $x_r(m)$ is the rth IFFT output, and $x_r(s)$ is the rth filter output. The filter impulse response g(u) is obtained for a low-pass filter designed at a processing rate of I times the baseband symbol rate, through well-known techniques. Each of the M filters performs a sampling rate change of I/(DM), where M is the number of points in the IFFT, e.g., 16, I is the interpolation rate, e.g., 125, and D is the decimation rate, e.g., 7. The sampling rate change for the example values is thus 125/112, a fractional rate change. The synthesized frequency spacing is given by $$f_\Delta = \frac{I}{DM} f_b$$

where $f_b$ is the baseband symbol or sample rate. The filter impulse response, g(u), is designed at a sampling rate of $f_s = If_b$. The filter bank architecture is derived as follows.

It is desired to pulse shape or filter and modulate M subchannels of data. The filtering and modulation of the kth subchannel can be expressed as a product of a phasor and a convolution sum.

$$x_k(n) = e^{j\frac{2\pi}{M}kn} \sum_{m=-\infty}^{\infty} X_k(m) g(nD - mI)$$

The composite waveform is then expressed as the sum of all $x_k(n)$.

$$x(n) = \frac{1}{M} \sum_{k=0}^{M-1} e^{j\frac{2\pi}{M}kn} \sum_{m=-\infty}^{\infty} X_k(m) g(nD - mI)$$

Switching the order of summation, this can be expressed as $$x(n) = \sum_{m=-\infty}^{\infty} g(nD - mI) \frac{1}{M} \sum_{k=0}^{M-1} X_k(m) e^{j\frac{2\pi}{M}kn}.$$

Making the substitution n=r+sM yields $$x(r+sM) = \sum_{m=-\infty}^{\infty} g(rD + sMD - mI) \frac{1}{M} \sum_{k=0}^{M-1} X_k(m) e^{j\frac{2\pi}{M}k(r+sM)}.$$

Because $e^{j2\pi Z}$ is equal to 1 if Z is any integer, the inside summation may be expressed in the form of an IFFT.

$$x(r+sM) = \sum_{m=-\infty}^{\infty} g(rD + sMD - mI) \frac{1}{M} \sum_{k=0}^{M-1} X_k(m) e^{j\frac{2\pi}{M}kr},$$

or equivalently, $$x_r(s) = \sum_{m=-\infty}^{\infty} g(rD + sMD - mI) x_r(m),$$

where $x_r(m)$ is the rth point of the IFFT output. This is a general expression for up-down resampling of a signal with the filtering function g(u).

In the past, such filter bank structures have been considered undesirable for generating multiple subchannels because of the non-integer relationship between the baud rate or base sampling rate and the desired frequency spacing required for efficient spectrum utilization, as explained herein above. However, this structure has many similarities to a single-channel polyphase interpolation/decimation structure.

Consider the following single channel interpolator/decimator.

$$x(n) = \sum_{m=-\infty}^{\infty} g(nD - mI) x(m)$$

It can be decomposed and implemented in the same manner as the multiple-channel interpolator/decimator.

$$x_r(s) = \sum_{m=-\infty}^{\infty} g(rD + sMD - mI)x_r(m).$$

The only difference in the implementation is that the filter history in the multiple-channel case changes with every change in the commutator position index r. With synchronized buffers, this can be accomplished with a minimal addressing overhead.

Prior-art polyphase filters have synchronized the position of the commutator with the phase of the filter impulse response. The present invention demonstrates that the phase of the filter impulse response utilized for each commutator position can be decoupled from the position of the commutator without disrupting the operation of the polyphase filter—an unexpected result! Decoupling the phase of the filter impulse response from the position of the commutator advantageously allows the polyphase filter to make non-integer sampling rate changes, as explained below.

Figure 4:
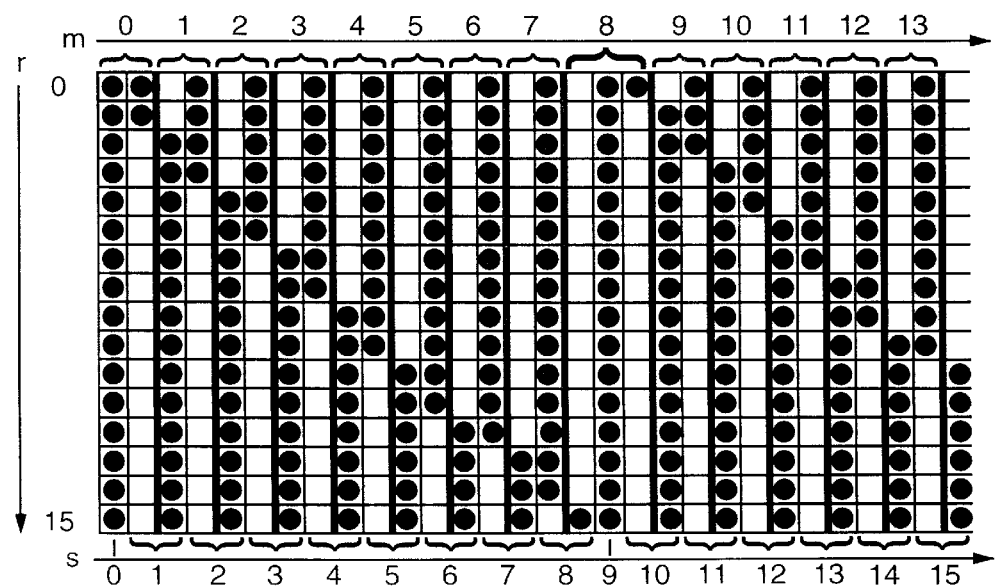
FIG. 4 is an exemplary input buffer incrementation diagram for the multisubchannel modulation engine in accordance with the present invention.

The input buffers are incremented in a synchronous fashion across all channels as depicted FIG. 4, which depicts an exemplary input buffer incrementation diagram 400 for the multisubchannel modulation engine 300 in accordance with the present invention. Each row represents the position of the commutator 308 as determined by the commutator position index r. The input sample index m indicates the input sample being processed by the filter 304. The commutator cycle index s advances each time the commutator 308 has completed a full cycle of M, e.g., 16, calculations. The black dots represent steps through selected predetermined phases of the filter impulse response corresponding to r, s, and m. In columns 1 and 2, for example, because of the non-integer rate change between the input and output, the polyphase filter 304 utilizes 18 phases of the filter impulse response for the first input sample. (Prior-art polyphase filters would utilize 16, 32 48, . . . phases when M=16, as in this example.) In the prior-art filter, if each of the 16 input samples were touched once for each full commutator cycle, that would be an example of critical sampling (with no separation between the subchannels), if each of the 16 input samples were touched an integer number of times in each block (demarcated by the bold lines), that would be a typical application of prior-art FFT/polyphase multisubchannel modulation (with the subchannels too widely separated).

It is important to note that the 18 phases of the filter impulse response in the above example represent a single pass through selected phases of the entire stored filter impulse response. That is, the phases used for the first two rows of the second column are NOT the same phases used for the first two rows of the first column, as has been the case in the prior-art polyphase filter. Instead of being tied to the commutator position, the current phase index $\phi_n$ of the filter impulse response is calculated as a function of the decimation rate D, the interpolation rate I, the starting phase index $\phi_s$ and the output sample index n of the multichannel polyphase filter.

$$\phi_n = (Dn + \phi_s) \text{Modulo}(I)$$

Also, unlike the prior art, the input sample index m does not advance in synchronism with the commutator cycle index s, but is determined from current phase index $\phi_n$, the decimation rate D, and the interpolation rate I.

$$\text{If}(\phi_n + D) > I,$$

then advance the input sample index m after the current calculation.

It is interesting to note in the diagram 400 that the columns corresponding to m=6 and m=13 contain only 17 phases of the filter impulse response, instead of the 18 phases corresponding to the other values of m. This is because, in the example, I=125 and D=7. There are thus 125 possible phase index values that are stepped through in hops spaced 7 phases apart. Then it follows that I/D=125/7=17 6/7. Thus in every 7th pass through the phases of the filter impulse response, the end of the filter is reached in only 17 hops, and it is time to move on to the next input sample.

Advantageously, this technique requires very little RAM. The IFFT can be performed with an in-place algorithm, and no intermediate signal storage is required for the filtering. For complex symbols or samples, the required memory for the whole filtering process is roughly (4 times the batch duration times the output rate) RAM locations and (I times the number of symbols in the filter response) ROM locations for the filter coefficients.

Figure 5:
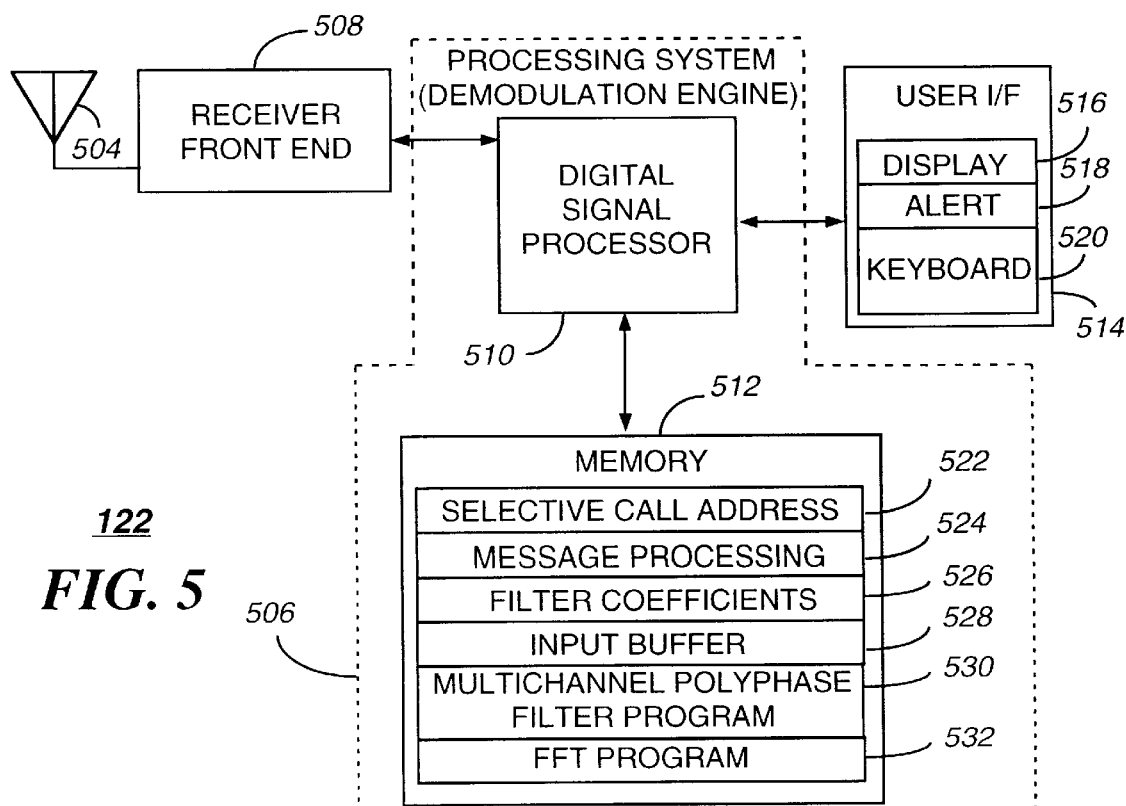
FIG. 5 is an electrical block diagram of an exemplary receiver in accordance with the present invention.

FIG. 5 is an electrical block diagram of an exemplary receiver 122 for demodulating at least two of M subchannels in parallel, wherein M is a positive integer greater than unity, in accordance with the present invention. The receiver 122 comprises an antenna 504 for intercepting a message. The antenna 504 is coupled to a conventional receiver front end 508 for receiving the message. The receiver front end 508 is for converting a wireless signal having the M subchannels into a composite signal having a sampling rate and derived from at least two of the M subchannels. The receiver front end 508 is coupled to a processing system 506 for processing the message and for controlling the receiver 122. A user interface 514 preferably is also coupled to the processing system 506 for providing an interface with a user. The user interface 514 preferably comprises a conventional display 516 for displaying messages, a conventional alert element 518 for alerting the user when a message arrives, and a conventional keyboard 520 for controlling the receiver 122. It will be appreciated that some models of the receiver 122, e.g., receivers for controlling a device, can replace the user interface 514 with a conventional device interface (not shown). The processing system 506 preferably comprises a conventional digital signal processor (DSP) 510 and a conventional memory 512. In the preferred embodiment, the DSP is a model DSP56800, manufactured by Motorola, Inc. of Schaumburg, Ill., and executes software readily written by one of ordinary skill in the art, given the teachings of the instant disclosure. It will be appreciated that, alternatively, other similar DSPs can be substituted for the DSP56800. It will be further appreciated that, alternatively, some or all of the processing system 506 can be realized in hardware instead of through software programming of the DSP and, in addition, that the memory 512 can be integral to the DSP 510.

The memory 512 comprises software elements and other variables for programming the processing system 506 in accordance with the present invention. The memory 512 preferably includes a selective call address 522 to which the receiver 122 is responsive. In addition, the memory 512 includes a message processing element 524 for programming the processing system 506 to process messages through well-known techniques. The memory 512 also includes filter coefficients 526 describing a filter impulse response in accordance with the present invention. In addition, the memory 512 includes an input buffer 528 used for storing input samples. The memory 512 further comprises a multichannel polyphase filter program 530 and a fast Fourier transform (FFT) program 532, in accordance with the present invention. Operation of the processing system 506 in accordance with the present invention will be described further below.

Figure 6:
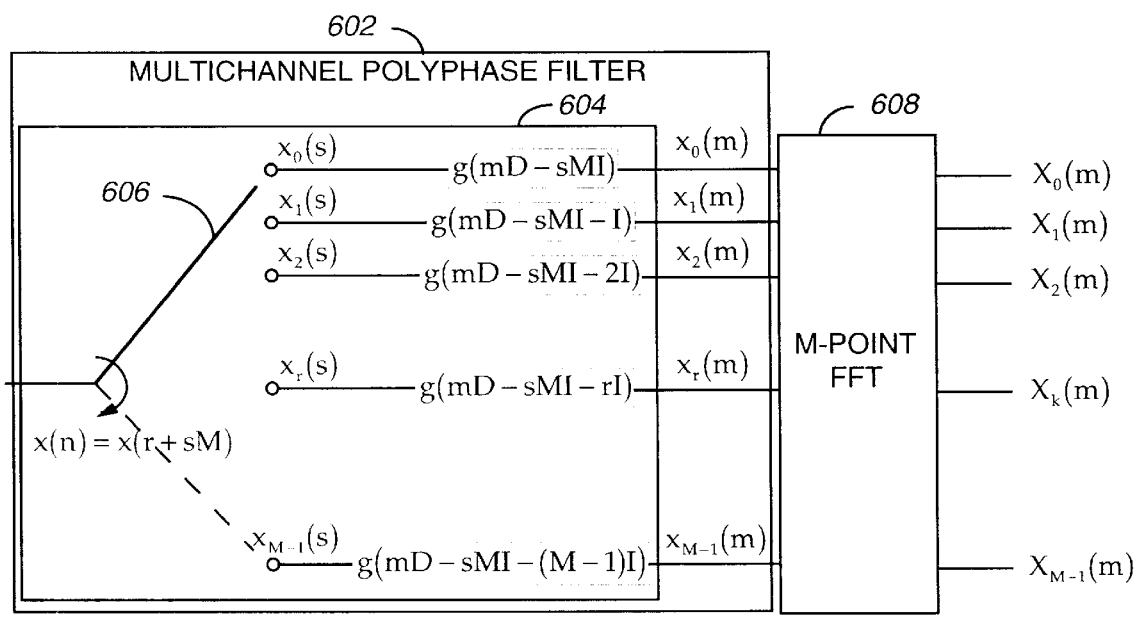
FIG. 6 is an architecture diagram of an exemplary multisubchannel demodulation engine in accordance with the present invention.

FIG. 6 is an architecture diagram of an exemplary multisubchannel demodulation engine 600 in accordance with the present invention. The demodulation engine 600 comprises a multichannel polyphase filter 602 for accepting the composite signal from the receiver front end 508 and for performing a non-integer sampling rate change on the composite signal. The multichannel polyphase filter 602 comprises a filter processor 604 for accepting and processing the composite signal. The filter processor 604 is arranged to provide a commutator 606 for the multichannel polyphase filter 602, wherein the position of the commutator 606 is decoupled from the phase of a filter impulse response selected for the position, thereby allowing the multichannel polyphase filter 602 to be operated at a sampling rate that is a non-integer multiple of the sampling rate of the composite signal. The filter processor 604 is further arranged to operate the multichannel polyphase filter 602 at the non-integer multiple of the sampling rate of the composite signal to obtain the non-integer sampling rate change, thereby generating at least two rate-changed signals. The demodulation engine 600 also includes a fast Fourier transform (FFT) processor 608 coupled to the multichannel polyphase filter 602 and arranged to transform the at least two rate-changed signals into at least two frequency-domain signals, thereby generating at least two baseband signals. Preferably, both the filter processor 604 and the FFT processor 608 are implemented in the processing system 506.

In somewhat greater detail, $X_k(m)$ are low sampling rate asynchronous waveforms on the kth subchannel, $x_r(s)$ is the rth filter bank input, and $x_r(m)$ is the rth filter output. The filter impulse response, $g(u)$, is obtained for a low-pass filter designed at a processing rate of I times the sampling rate of $x(n)$, through well-known techniques. Each of the M filters performs a rate change of IM/D, where M is the number of points in the FFT. After commutation, the synthesized frequency spacing is given by $$f_\Delta = \frac{1}{M} f_s,$$

where $f_s$ is the sample rate of $x(n)$. The filter bank architecture is derived as follows.

It is desired to demodulate and pulse shape or filter M subchannels of data. The filtering and downsampling of the kth subchannel can be expressed as follows.

$$X_k(m) = \sum_{n=-\infty}^{\infty} x(n) e^{-j\frac{2\pi}{M}kn} g(mD - nI)$$

The commutation can be expressed with the substitution, n=r+sM.

$$X_k(m) = \sum_{r=0}^{M-1} \sum_{s=-\infty}^{\infty} x(r+sM) e^{-j\frac{2\pi}{M}k(r+sM)} g(mD - sMI - rI).$$

Because $e^{j2\pi Z}$ is equal to 1 if Z is any integer, the exponential term may be pulled out of the summation.

$$X_k(m) = \sum_{r=0}^{M-1} e^{-j\frac{2\pi}{M}kr} \sum_{s=-\infty}^{\infty} x(r+sM) g(mD - sMI - rI), \text{ or}$$

$$X_k(m) = \sum_{r=0}^{M-1} x_r(m) e^{-j\frac{2\pi}{M}kr},$$

where $x_r(m)$ is the rth filter output.

For reasons explained earlier herein, in the past such filter bank structures have been considered undesirable for multiple subchannels, because of the non-integer relationship between the baud rate or base sampling rate and the desired frequency spacing. However, this structure has many similarities to a single-channel polyphase interpolation/decimation structure. Consider the following single channel interpolator/decimator.

$$y(m) = \sum_{n=-\infty}^{\infty} g(mD - nI) x(n)$$

It can be decomposed and implemented in the same manner as the multiple channel interpolator/decimator.

$$y(m) = \sum_{r=0}^{M-1} \sum_{s=-\infty}^{\infty} g(mD - sMI - rI) x(r+sM)$$

The only difference in the implementation is that the output of each filter bank in the multiple subchannel case is routed to a different FFT input buffer.

As before, the key is that by decoupling the phase of the filter impulse response from the position of the commutator 606, the non-integer rate change advantageously becomes possible in the multichannel polyphase filter 602. Instead of being tied to the commutator position, the current phase index $\phi_{r,m}$ of the filter impulse response is calculated as a function of the decimation rate D, the interpolation rate I, the output sample index m, the commutator position index r, the number of points in the FFT M, and the starting phase index $\phi_s$ of the filter impulse response.

$$\phi_{r,m} = (\phi_s + Dm - Ir) \text{Modulo}(MI)$$

It will be appreciated that, at start-up, the starting phase index $\phi_s$ preferably is set to a value that time-aligns the filter impulse response with the symbol centers of the input samples $x(n)$, through well-known synchronization techniques.

Also, unlike the prior art, the output sample index m and the commutator cycle index s do not advance in synchronism, but advances in the commutator cycle index s are determined from the current phase index $\phi_{r,m}$, the number of points in the FFT M, the interpolation rate, and the decimation rate D.

$$\text{If}(\phi_{r,m} + D) > MI,$$

then advance the commutator cycle index s after the current calculation. It will be appreciated that s also has to change in synchronism with the incoming data stream, so timing of the calculations of the processing system 506 is arranged to assure that that happens.

As in the modulation engine 300, this technique requires very little RAM. The FFT can be performed with an in-place algorithm, and no intermediate signal storage is required for the filtering. For complex symbols or samples, the required memory for the whole filtering process is roughly (4 times the batch duration times the output rate) RAM locations and (I times the number of base sampling rate samples in the filter response) ROM locations for the filter coefficients. In one application evaluated, the present invention yields a reduction in processing power requirements, or MIPS, by a factor of about three and a significant improvement in the RAM requirements, compared to prior-art techniques.

Thus, it should be clear from the preceding disclosure that the present invention provides an apparatus for performing a non-integer sampling rate change in a multichannel polyphase filter. Advantageously, the apparatus enables efficient multisubchannel polyphase modulation and demodulation engines that have superior flexibility of subchannel spacing.

Many modifications and variations of the present invention are possible in light of the above teachings. Thus, it is to be understood that, within the scope of the appended claims, the invention can be practiced other than as specifically described herein above.

What is claimed is:

1. A multichannel polyphase filter for performing a non-integer sampling rate change, the multichannel polyphase filter comprising:

a processing system for accepting and processing M input channels of data, each sampled at an input sampling rate, wherein M is a positive integer greater than unity, and wherein the processing system is programmed to:

provide a commutator for the multichannel polyphase filter, wherein position of the commutator is decoupled from phase of a filter impulse response selected for the position, thereby allowing the multichannel polyphase filter to be operated at a sampling rate that is a non-integer multiple of the input sampling rate;

operate the multichannel polyphase filter at the non-integer multiple of the input sampling rate to obtain the non-integer sampling rate change;

determine a phase index of the filter impulse response as a function of a decimation rate, an interpolation rate, a starting phase index, and an output sample index of the multichannel polyphase filter, when the multichannel polyphase filter is employed in a modulator; and determine the phase index of the filter impulse response as a function of M and the decimation rate, the intepolation rate, the starting phase index, a commutator position index, and the output sample index of the multichannel polyphase filter, when the multichannel polyphase filter is employed in a demodulator.

2. The multichannel polyphase filter of claim 1, wherein the processing system is further programmed to advance an input sample index whenever a current phase index of the filter impulse response, plus the decimation rate of the multichannel polyphase filter, exceeds the interpolation rate of the multichannel polyphase filter.

3. The multichannel polyphase filter of claim 1, wherein the processing system is further programmed to advance a commutator cycle index whenever a current phase of the filter impulse response, plus the decimation rate of the multichannel polyphase filter, is greater then M times the interpolation rate of the multichannel polyphase filter.

4. The multichannel polyphase filter of claim 1, wherein the processing system is further programmed to calculate a current phase index of the filter impulse response as $\phi_n = (Dn + \phi_s) \text{Modulo}(I)$ when the multichannel polyphase filter is employed in a modulator, wherein D is the decimation rate, I is the interpolation rate, $\phi_s$ is the starting phase index, and n is the output sample index.

5. The multichannel polyphase filter of claim 1, wherein the processing system is further programmed to calculate a current phase index of the filter impulse response as $\phi_{r,m} = (\phi_s + Dm - Ir) \text{Modulo}(MI)$ when the multichannel polyphase filter is employed in a demodulator, wherein $\phi_s$ is the starting phase index, D is the decimation rate, m is the output sample index, I is the interpolation rate, and r is the commutator position index.

6. A modulation engine for facilitating a modulation of M subchannels in parallel, wherein M is a positive integer greater than unity, the modulation engine comprising:

first processing means, arranged to:

accept M baseband signals corresponding to the M subchannels and sampled at a baseband sampling rate; and transform the M baseband signals into M time-domain signals, each sampled at the baseband sampling rate; and a multichannel polyphase filter coupled to the first processing means for performing a non-integer sampling rate change on the M time-domain signals, the multichannel polyphase filter comprising:

second processing means for accepting and processing the M time-domain signals, wherein the second processing means is arranged to:

provide a commutator for the multichannel polyphase filter, wherein position of the commutator is decoupled from phase of a filter impulse response selected for the position, thereby allowing the multichannel polyphase filter to be operated at a sampling rate that is a non-integer multiple of the sampling rate of the M time-domain signals;

determine a phase index of the filter impulse response as a function of a decimation rate, an interpolation rate, a starting phase index, and an output sample index of the multichannel polyphase filter; and operate the multichannel polyphase filter at the non-integer multiple of the sampling rate of the M time-domain signals to obtain the non-integer sampling rate change.

7. The modulation engine of claim 6, wherein the second processing means is further arranged to produce a frequency-multiplexed composite signal representing the M baseband signals and having a frequency spacing that is a non-integer multiple of the baseband sampling rate.

8. The modulation engine of claim 6, wherein the first and second processing means are realized with a single digital signal processor.

9. The modulation engine of claim 6, wherein the second processing means is further arranged to advance an input sample index whenever a current phase index of the filter impulse response, plus the decimation rate of the multichannel polyphase filter, exceeds the interpolation rate of the multichannel polyphase filter.

10. The modulation engine of claim 6, wherein the second processing means is further arranged to calculate a current phase index of the filter impulse response as $$\phi_n = (Dn + \phi_s) \text{Modulo}(I),$$

wherein D is the decimation rate, I is the interpolation rate, $\phi_s$ is the starting phase index, and n is the output sample index.

11. A demodulation engine for facilitating a demodulation of at least two of M subchannels in parallel, wherein M is a positive integer greater than unity, the demodulation engine comprising:

a multichannel polyphase filter for accepting from a receiver a composite signal derived from the at least two of the M subchannels and for performing a non-integer sampling rate change on the composite signal, the multichannel polyphase filter comprising:

first processing means for accepting and processing the composite signal, wherein the first processing means is arranged to:

provide a commutator for the multichannel polyphase filter, wherein position of the commutator is decoupled from phase of a filter impulse response selected for the position, thereby allowing the multichannel polyphase filter to be operated at a sampling rate that is a non-integer multiple of the sampling rate of the composite signal;

determine a phase index of the filter impulse response as a function of M and a decimation rate, an interpolation rate, a starting phase index, a commutator position index, and an output sample index of the multichannel polyphase filter; and operate the multichannel polyphase filter at the non-integer multiple of the sampling rate of the composite signal to obtain the non-integer sampling rate change, thereby generating at least two rate-changed signals; and second processing means coupled to the multichannel polyphase filter and arranged to transform the at least two rate-changed signals into at least two frequency-domain signals, thereby generating at least two baseband signals.

12. The demodulation engine of claim 11, wherein the first and second processing means are realized with a single digital signal processor.

13. The demodulation engine of claim 11, wherein the first processing means is further arranged to advance a commutator cycle index whenever a current phase index of the filter impulse response, plus the decimation rate of the multichannel polyphase filter, is greater than M times the interpolation rate of the multichannel polyphase filter.

14. The demodulation engine of claim 11, wherein the first processing means is further arranged to calculate a current phase index of the filter impulse response as $$\phi_{r,m}=(\phi_s+Dm-Ir)Modulo(MI),$$

wherein $\phi_s$ is the starting phase index, D is the decimation rate, m is the output sample index, I is the interpolation rate, and r is the commutator position index.

15. A transmitter for modulating M subchannels in parallel, wherein M is a positive integer greater than unity, the transmitter comprising:

first processing means arranged to:

accept M baseband signals corresponding to the M subchannels and sampled at a baseband sampling rate; and transform the M baseband signals into M time-domain signals, each sampled at the baseband sampling rate; and a multichannel polyphase filter coupled to the first processing means for performing a non-integer sampling rate change on the M time-domain signals, the multichannel polyphase filter comprising:

second processing means for accepting and processing the M time-domain signals, wherein the second processing means is arranged to:

provide a commutator for the multichannel polyphase filter, wherein position of the commutator is decoupled from phase of a filter impulse response selected for the position, thereby allowing the multichannel polyphase filter to be operated at a sampling rate that is a non-integer multiple of the baseband sampling rate;

determine a phase index of the filter impulse response as a function of a decimation rate, an interpolation rate, a starting phase index, and an output sample index of the multichannel polyphase filter; and operate the multichannel polyphase filter at the non-integer multiple of the baseband sampling rate to obtain the non-integer sampling rate change and to generate a frequency-multiplexed composite signal; and a wireless modulator for modulating a wireless carrier with the frequency-multiplexed composite signal to produce a wireless signal having M subchannels.

16. The transmitter of claim 15, wherein the second processing means is further arranged to produce a frequency-multiplexed composite signal representing the M baseband signals and having a frequency spacing that is a non-integer multiple of the baseband sampling rate.

17. The transmitter of claim 15, wherein the first and second processing means are realized with a single digital signal processor.

18. A receiver for demodulating at least two of M subchannels in parallel, wherein M is a positive integer greater than unity, the receiver comprising:

a receiver front end for converting a wireless signal having the M subchannels into a composite signal having a sampling rate and derived from the at least two of the M subchannels;

a multichannel polyphase filter coupled to the receiver front end for accepting from the receiver the composite signal and for performing a non-integer sampling rate change on the composite signal, the multichannel polyphase filter comprising:

first processing means for accepting and processing the composite signal, wherein the first processing means is arranged to:

provide a commutator for the multichannel polyphase filter, wherein position of the commutator is decoupled from phase of a filter impulse response selected for the position, thereby allowing the multichannel polyphase filter to be operated at a sampling rate that is a non-integer multiple of the sampling rate of the composite signal;

determine a phase index of the filter impulse response as a function of M and a decimation rate, an interpolation rate, a starting phase index, a commutator position index, and an output sample index of the multichannel polyphase filter; and operate the multichannel polyphase filter at the non-integer multiple of the sampling rate of the composite signal to obtain the non-integer sampling rate change, thereby generating at least two rate-changed signals; and second processing means coupled to the multichannel polyphase filter and arranged to transform the at least two rate-changed signals into at least two frequency-domain signals, thereby generating at least two baseband signals.

19. The receiver of claim 18, wherein the first and second processing means are realized with a single digital signal processor.

* * * * *